United States Patent
Osaki et al.

(10) Patent No.: US 8,248,240 B2
(45) Date of Patent: Aug. 21, 2012

(54) RFID TAG AND MANUFACTURING METHOD THEREOF

(75) Inventors: Noritsugu Osaki, Kawasaki (JP); Shunji Baba, Kawasaki (JP); Shigeru Hashimoto, Inagi (JP); Yoshiyasu Sugimura, Inagi (JP); Satoru Nogami, Inagi (JP)

(73) Assignees: Fujitsu Limited, Kawasaki (JP); Fujitsu Frontech Limited, Tokyo (JP)

( * ) Notice: Subject to any disclaimer, the term of this patent is extended or adjusted under 35 U.S.C. 154(b) by 936 days.

(21) Appl. No.: 12/181,631

(22) Filed: Jul. 29, 2008

(65) Prior Publication Data

US 2009/0085747 A1    Apr. 2, 2009

(30) Foreign Application Priority Data

Sep. 28, 2007  (JP) .................. 2007-256270

(51) Int. Cl.
  *G08B 13/14*  (2006.01)
  *G06K 19/06*  (2006.01)
  *G06K 7/00*  (2006.01)

(52) U.S. Cl. .............. 340/572.1; 340/572.8; 235/492; 235/435

(58) Field of Classification Search ........... 340/572.8; 235/492, 435
See application file for complete search history.

(56) References Cited

U.S. PATENT DOCUMENTS

| | | | |
|---|---|---|---|
| 6,509,217 B1 * | 1/2003 | Reddy | 438/153 |
| 2003/0076662 A1 | 4/2003 | Miehling | |
| 2004/0217472 A1 * | 11/2004 | Aisenbrey et al. | 257/734 |
| 2005/0168339 A1 * | 8/2005 | Arai et al. | 340/572.8 |
| 2005/0212131 A1 | 9/2005 | Kawai | |
| 2007/0007344 A1 * | 1/2007 | Inoue et al. | 235/435 |
| 2008/0042851 A1 | 2/2008 | Baba et al. | |
| 2010/0156723 A1 * | 6/2010 | Luch | 343/700 MS |

FOREIGN PATENT DOCUMENTS

| | | |
|---|---|---|
| EP | 1 744 268 A2 | 1/2007 |
| JP | 2000-200332 A | 7/2000 |
| JP | 2000-311176 A | 11/2000 |
| JP | 2001-351082 A | 12/2001 |
| JP | 2004-171175 A | 6/2004 |
| JP | 2005-275802 A | 10/2005 |
| JP | 2005-354661 A | 12/2005 |
| JP | 2007-042087 A | 2/2007 |
| JP | 2007-079526 A | 3/2007 |
| JP | 2008-46668 A | 2/2008 |

OTHER PUBLICATIONS

Martin Tarr, Coefficient of Thermal Expansion, Dec. 26, 2004,Creative Commons Attribution-NonCommercial-ShareAlike 2.0 Licences. http://www.ami.ac.uk/courses/topics/0197_cte/index.html.*
European Search Report dated Feb. 4, 2009, issued in corresponding European Patent Application No. 08161525.4.
European Office Action dated Mar. 14, 2011, issued in corresponding European Patent Application No. 08161525.4.
JP Office Action dated Apr. 17, 2012 for Japanese application No. 2007-256270.

* cited by examiner

*Primary Examiner* — George Bugg
*Assistant Examiner* — Jack Wang
(74) *Attorney, Agent, or Firm* — Westerman, Hattori, Daniels & Adrian, LLP

(57) ABSTRACT

An RFID tag includes an inlay which has a base, an antenna formed on the base, and an IC chip. The IC chip is enclosed in a surface mount package and soldered to the antenna and carries out radio communication through the antenna. The RFID tag further includes underfill that fills a gap between the base and the surface mount package, and a sheath protecting material enclosing the entire inlay.

4 Claims, 5 Drawing Sheets

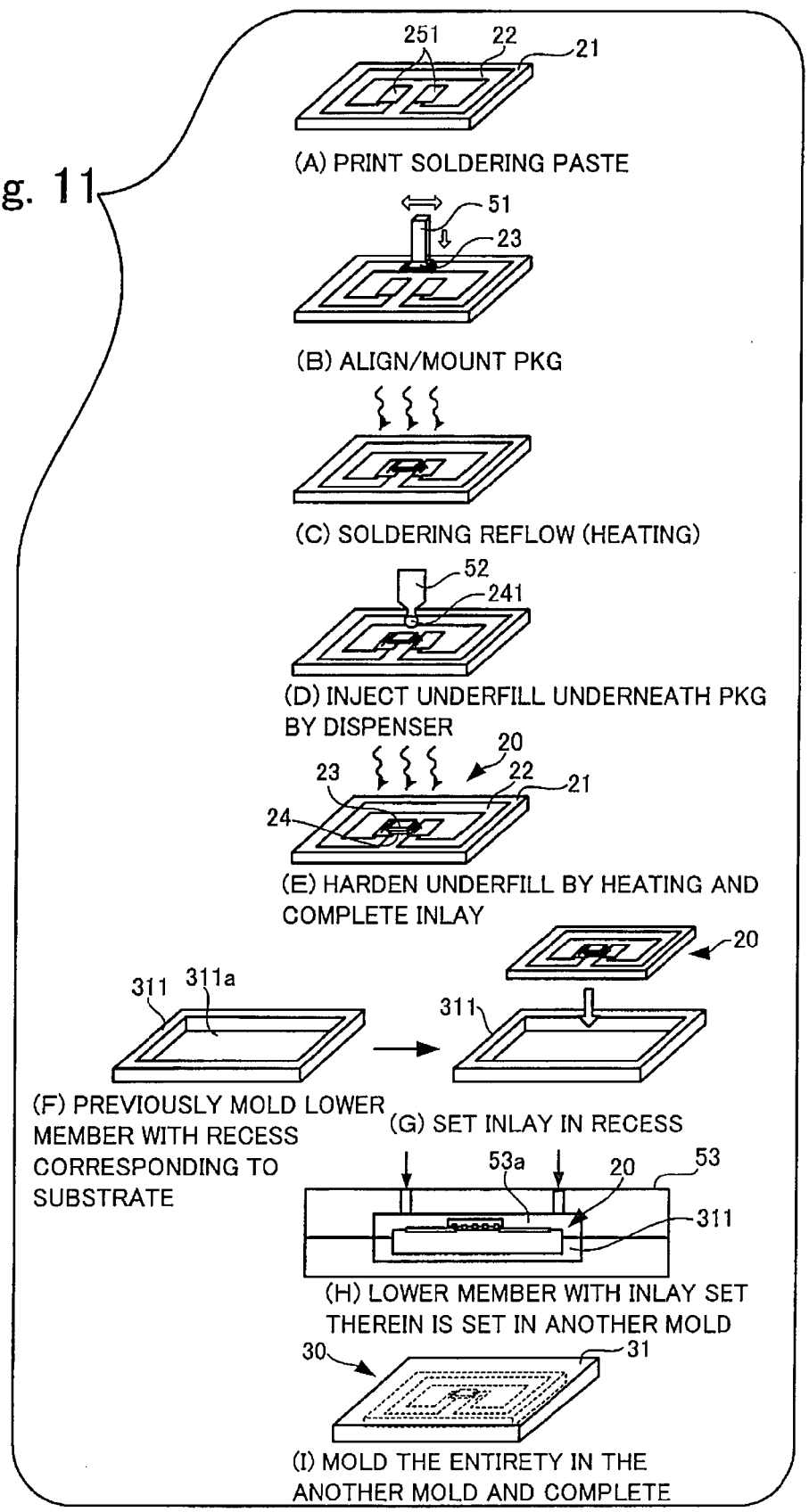

RFID TAG AND MANUFACTURING METHOD THEREOF

BACKGROUND OF THE INVENTION

1. Field of the Invention

The present invention relates to an RFID (Radio Frequency IDentification) tag through which information is exchanged with external equipment in a non-contact manner. The "RFID tag" is called "radio IC tag" in some cases.

2. Description of the Related Art

In recent years, there are proposed various RFID tags through which information is exchanged with external equipment such as a reader/writer in a non-contact manner (see Japanese Patent Application Publication Nos. 2000-311176, 2000-200332 and 2001-351082, for example).

FIG. 1 is a schematic sectional view showing a structure of an ordinary RFID tag.

According to the RFID tag 10 shown in FIG. 1, an antenna pattern 12 is formed on a substrate 11 made of PET, a circuit which carries out radio communication through the antenna pattern 12 is incorporated in an IC chip 13, the IC chip 13 in its bare state is soldered to the antenna pattern 12 with solder 14, a filler 15 is poured into a space under a lower surface of the IC chip 13 and is solidified, thereby forming an RFID tag inlay to which the IC chip 13 is strongly secured, an adhesion layer 16 is placed on the RFID tag inlay and is sealed with a label 17.

In the case of the RFID tag 10 having the structure shown in FIG. 1, however, the following problems are found:

since thermal expansion coefficients of silicon which is a base body of the IC chip 13 and the flexible substrate 11 made of PET are large, long term bonding reliability is poor; and water or moisture is prone to enter from an end edge of the adhesion layer 16 between the label 17 and the inlay, and the IC chip 13 cannot be applied to a high moisture environment, outside or the like.

Japanese Patent Application Publication No. 2005-275802 discloses an idea to enhance the mounting reliability of the IC chip, but this idea relates to reliability when the chip is mounted, and it is unclear as to the long term stability.

In addition, in the Japanese Patent Application Publication No. 2005-275802, the IC chip is bare, and waterproofing is not provided.

Further, Japanese Patent Application Publication No. 2005-354661 discloses an idea to avoid influence of radio communication on an electronic circuit substrate in a device such as a cellular phone having a radio antenna section, a non-contact communication device which carries out radio communication between the non-contact communication device and external equipment through the radio antenna section, and an electronic circuit substrate, but there is no relation to the long term reliability in respect to influence of temperature, moisture and the like.

SUMMARY OF THE INVENTION

In view of the above circumstances, the present invention to provides an RFID tag having excellent long term reliability.

An RFID tag according to the invention includes:

an inlay which has a base, an antenna formed on the base, an IC chip which is enclosed in a surface mount package and soldered to the antenna and which carries out radio communication through the antenna, and underfill which fills a gap between the base and the surface mount package; and a sheath protecting material enclosing the entire inlay.

According to the RFID tag of the present invention, the IC chip is first enclosed in the surface mount package, the surface mount package is mounted on the base and connected to the antenna, the surface mount package is strongly secured by underfill, and the entire inlay thus manufactured is enclosed in the sheath protecting material. Therefore, there is no margin of entrance of moisture, and an RFID tag having excellent long term stability is realized.

In the RFID tag of the present invention, it is preferable that where a thermal expansion coefficient of the surface mount package is defined as $\alpha 1$, a thermal expansion coefficient of the underfill is defined as $\alpha 2$, a thermal expansion coefficient of the base is defined as $\alpha 3$, and a thermal expansion coefficient of the sheath protecting material is defined as $\alpha 4$, relations $\alpha 1 < \alpha 2$ and $\alpha 4 < \alpha 3$ are satisfied.

If underfill having an intermediate thermal expansion coefficient $\alpha 2$ between a thermal expansion coefficient $\alpha 1$ of the surface mount package and a thermal expansion coefficient $\alpha 3$ of the base is employed as the underfill of the present invention, a soldering bond between the antenna on the base and the surface mount package is reliably maintained for a long term. Further, by employing a material having the thermal expansion coefficient $\alpha 4$ close to the average thermal expansion coefficient, i.e., a material having the relation of $\alpha 1 < \alpha 4 < \alpha 3$ for the sheath protecting material, the internal structure is stably maintained.

In the RFID tag of the present invention, it is preferable that the surface mount package is rectangular in shape as viewed from above, the surface mount package is provided with leads projecting from sides of the rectangular shape, the antenna and the IC chip enclosed in the surface mount package are connected with each other through any of the leads except those which are adjacent to corners at which two sides of the rectangular shape are in contact.

The surface mount package is usually rectangular in shape, and the corner portions at which two sides of the rectangle shape come into contact are most varied by the thermal expansion (or thermal contraction). Hence, the IC chip enclosed in the surface mount package and the antenna on the base are connected to each other through the leads except those adjacent to the corner portions. With this, the influence of thermal expansion and thermal contraction of the surface mount package is small, and the long term reliability is further enhanced.

In the RFID tag of the present invention, it is preferable that the surface mount package is rectangular in shape as viewed from above, connection terminals are arranged on a bottom surface of the surface mount package, the antenna and the IC chip enclosed in the surface mount package are connected with each other through any of the connection terminals except those which are adjacent to corners at which two sides of the rectangular shape are in contact.

For the same reason as above, the IC chip enclosed in the surface mount package and the antenna on the base are connected to each other through the connection terminals except those which are adjacent to the corner portions. With this, resistance to the influence of thermal expansion and thermal contraction of the surface mount package is achieved, and the long term reliability is further enhanced.

Further, the present invention provides a method of manufacturing an RFID tag having an inlay which includes a base, an antenna formed on the base, an IC chip which is enclosed in a surface mount package and soldered to the antenna and which carries out radio communication through the antenna, and underfill which fills a gap between the base and the surface mount package, and a sheath protecting material enclosing the entire inlay, the method including the steps of:

printing a soldering paste on a portion of the base on which the antenna is formed, the portion being where the surface mount package is to be soldered;

aligning and mounting the surface mount package on the base;

connecting the surface mount package to the antenna on the base by soldering reflow;

injecting underfill into a gap between the base and the surface mount package;

hardening the underfill, thereby completing the inlay;

disposing a resin lower member which has a recess into which the inlay is fitted and which corresponds to a lower portion of the sheath protecting material, together with the inlay fitted into the recess of the lower member, into a mold having a gap corresponding to an outer shape of the sheath protecting material; and molding the sheath protecting material by flowing resin corresponding to an upper portion of the sheath protecting material into the gap in the mold, thereby molding the upper portion and fusing the upper portion and the lower member together.

The RFID tag of the present invention is manufactured through the above manufacturing method.

According to the present invention, an RFID tag having excellent long term stability is realized.

BRIEF DESCRIPTION OF THE DRAWINGS

FIG. 11 is a diagram of steps showing one example of a manufacturing method of an RFID tag as an embodiment of the present invention.

DETAILED DESCRIPTION OF THE INVENTION

Embodiments of the present invention will be described.

Figure 1:
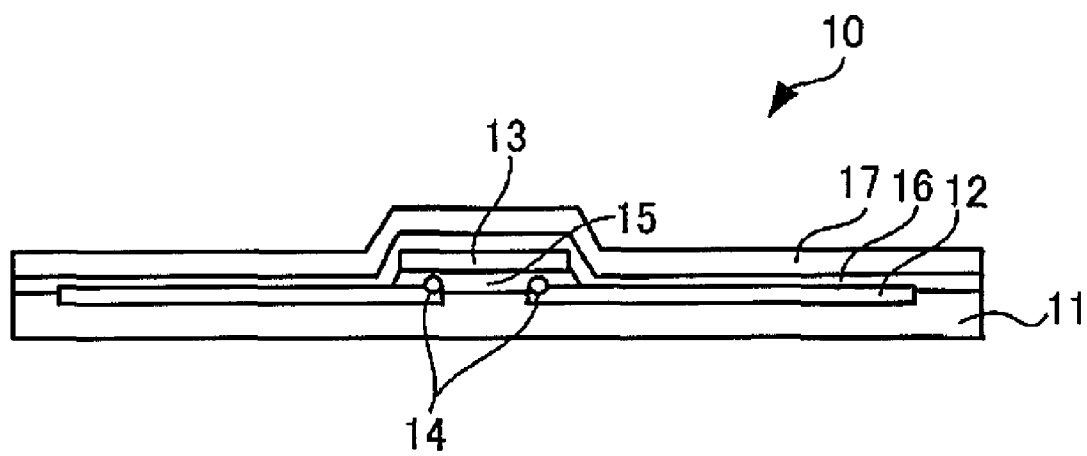
FIG. 1 is a schematic sectional view showing a structure of an ordinary RFID tag.
Figure 2:
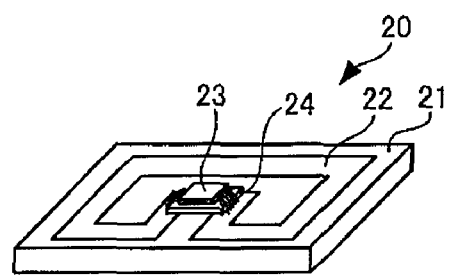
FIG. 2 is a diagram showing a structure of an inlay constituting a first embodiment of an RFID tag of the present invention.

FIG. 2 is a diagram showing a structure of an inlay constituting a first embodiment of an RFID tag of the present invention.

The inlay 20 shown in FIG. 2 includes a base 21 formed of a glass epoxy substrate, an antenna 22 formed by copper etching on the base 21, a surface mount package 23 which encloses an IC chip carrying out radio communication through the antenna 22 and which has a lead connected to the antenna 22 with solder, and an underfill 24 filling a gap between the base 21 and the surface mount package 23.

Figure 3:
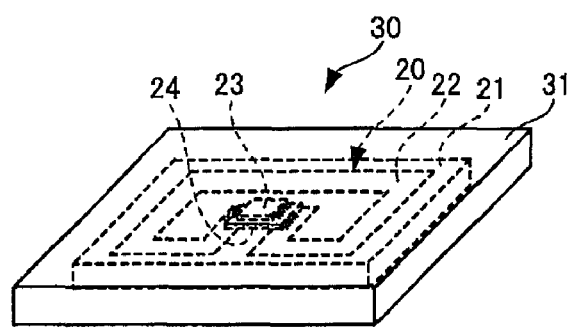
FIG. 3 is a diagram showing the RFID tag of the first embodiment.
Figure 4:
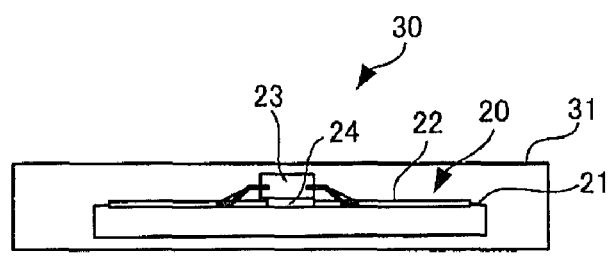
FIG. 4 is a sectional view of the RFID tag of the first embodiment.

FIG. 3 is a diagram showing the RFID tag of the embodiment, and FIG. 4 is a sectional view thereof.

The entire inlay 20 having a structure shown in FIG. 2 is enclosed in a sheath protecting material 31 by molding, thermocompression bonding or the like. The sheath protecting material 31 can be made of resin such as PTFE, PEEK and PPS.

According to the RFID tag 30 of the embodiment, the IC chip is enclosed in the surface mount package 23, the surface mount package 23 is strongly secured with the underfill 24, and the entire inlay 20 is enclosed in the sheath protecting material 31. Therefore, the RFID tag has long term reliability.

Materials are selected such that relations $\alpha 1 < \alpha 2$ and $\alpha 4 < \alpha 3$ are satisfied where:

a thermal expansion coefficient of the surface mount package 23 is defined as $\alpha 1$, a thermal expansion coefficient of the underfill 24 is defined as $\alpha 2$, a thermal expansion coefficient of the base 21 is defined as $\alpha 3$, and a thermal expansion coefficient of the sheath protecting material 31 is defined as $\alpha 4$.

Thus, the underfill 24 reduces stress caused by thermal expansion and thermal contraction between the surface mount package 23 and the base 21. The sheath protecting material 31 also has intermediate thermal expansion coefficient among members constituting the inlay 20, and this further enhances the long term stability of the RFID tag 30.

Figure 5:
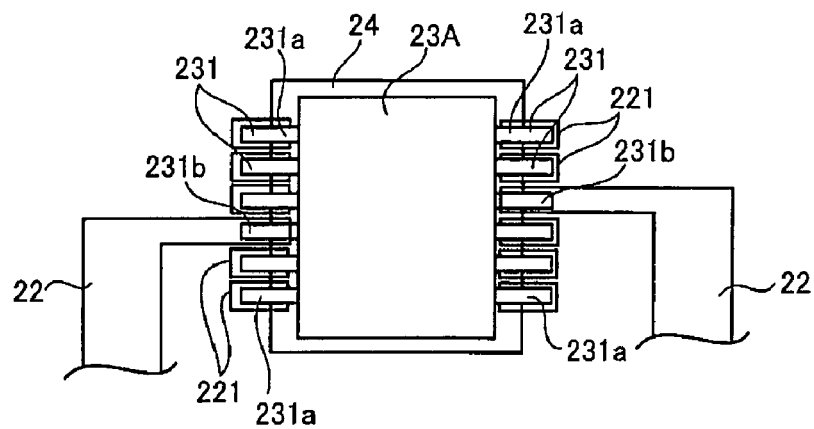
FIG. 5 is a plan view showing a connecting portion between a surface mount package and an antenna according to a second embodiment.

FIG. 5 is a plan view showing a connecting portion between a surface mount package and an antenna according to a second embodiment that is different from the first embodiment shown in FIGS. 2 to 4. The second embodiment is different from the first embodiment only in the connecting portion of the surface mount package and the antenna.

The surface mount package 23A is rectangular in shape as viewed from above, and leads 231 for soldering connection project from both left and right sides of the rectangular shape. Of the leads 231, certain leads except leads 231a which are adjacent to corner portions at which two sides of the rectangular shape are in contact, here, the leads 231b which are as close to the center as possible are connected to the antenna 22. The other leads that are not connected to the antenna 22 are soldered to connection pads 221 formed on the base 21. The connection pads 221 are made of the same material as that of the antenna 22. When the surface mount package 23 is thermally expanded or contracted due to variation in temperature, influence on a lead close to the center of the side is smaller than that of a lead close to the end (corner portion). Therefore, by using the leads close to the central portion of the side for connecting with the antenna 22, the long term stability is enhanced.

Figure 6:
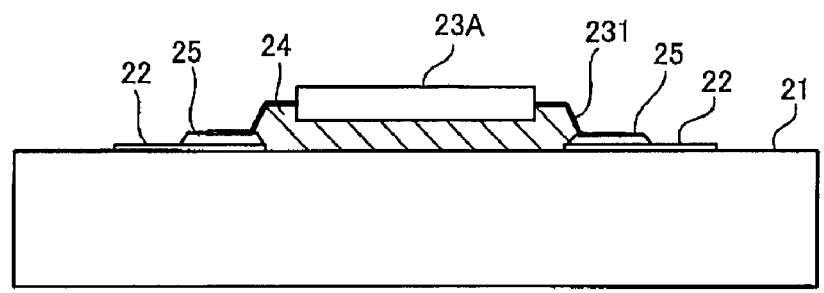
FIG. 6 is a sectional view showing the connecting portion between the surface mount package and the antenna shown in FIG. 5.

FIG. 6 is a sectional view of the connecting portion between the surface mount package and the antenna shown in FIG. 5.

A lead 231 projecting from the surface mount package 23A is connected to the antenna 22 formed on the base 21 or to the connection pad 221 (see FIG. 5) with solder 25, and the gap between the surface mount package 23A and the base 21 is filled with the underfill 24. The underfill 24 is made of material having an intermediate thermal expansion coefficient α2 between a thermal expansion coefficient α1 of the surface mount package 23A and a thermal expansion coefficient α3 of the base 21.

Figure 7:
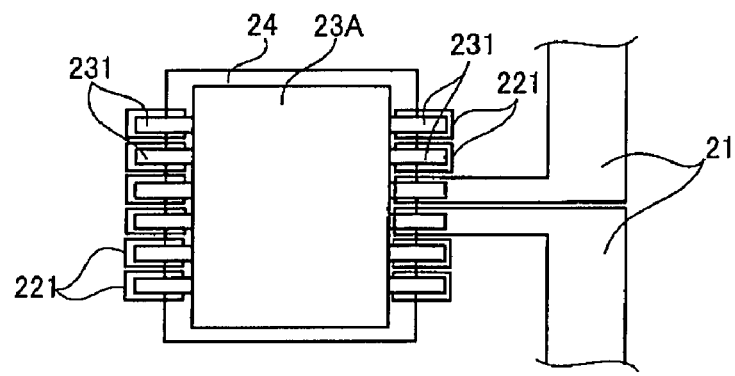
FIG. 7 is a plan view showing a connecting portion between a surface mount package and an antenna according to a third embodiment.

FIG. 7 is a plan view showing a connecting portion between a surface mount package and an antenna of a third embodiment.

The connecting portion of an antenna 21 with respect to the surface mount package 23A is adjacent only to one side of the surface mount package 23A.

In this case also, leads which are adjacent to corner portions of the surface mount package 23A are not used for connecting with the antenna 21, and leads as close to the center of the side as possible are used.

The embodiment shown in FIG. 7 is the same as the second embodiment shown in FIGS. 5 and 6 except the disposition of the surface mount package 23 and the antenna as described above.

Figure 8:
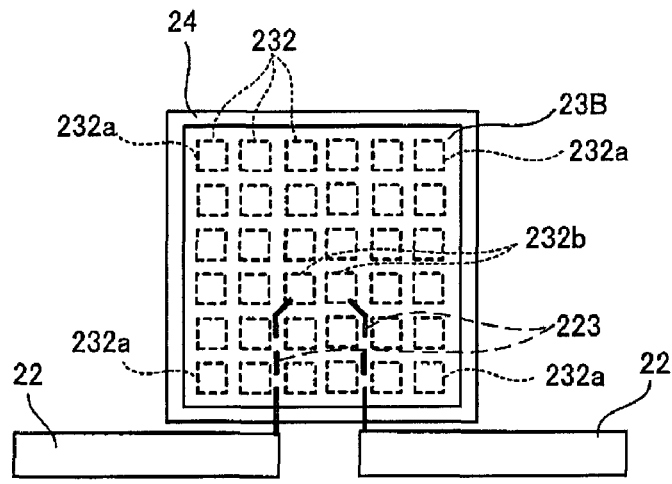
FIG. 8 is a plan view showing a connecting portion between a surface mount package and an antenna in an embodiment in which connection terminals are arranged on a bottom surface of the surface mount package.
Figure 9:
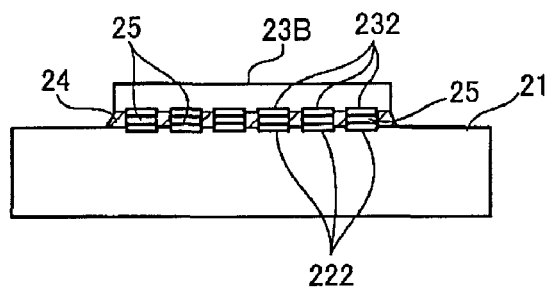
FIG. 9 is a sectional view showing the connecting portion between the surface mount package and the antenna in the embodiment in which the connection terminals are arranged on the bottom surface of the surface mount package.

FIG. 8 is a plan view showing a connecting portion between a surface mount package and an antenna in an embodiment in which connection terminals are arranged on a bottom surface of the surface mount package. The surface mount package is rectangular in shape as viewed from above. FIG. 9 is a sectional view of the part shown in FIG. 8.

A bottom surface of the surface mount package 23B is formed with a large number of connection terminals 232 for soldering connection. Connection pads 222 having the same arrangement as that of the connection terminals 232 are formed on the base in addition to the antenna 22. Each connection pad 222 and corresponding connection terminal 232 are connected with solder 25.

To reduce the influence caused by the thermal expansion and thermal contraction of the surface mount package 23B as much as possible, connection terminals 232a of the surface mount package 23B which are adjacent to corner portions at which two sides are in contact are not used for connection with the antenna 22, and connection terminals 232b close to a central portion of the bottom surface of the surface mount package 23B are used for connection with the antenna 22. The connection pads on the base 21 connected to the connection terminals 232b with solder are connected to the base 21 through the antenna 22 and lead wires 223 formed in the same manner as the connection pad 222.

In such connection, the gap between the surface mount package 23B and the base 21 is also filled with the underfill 24.

Figure 10:
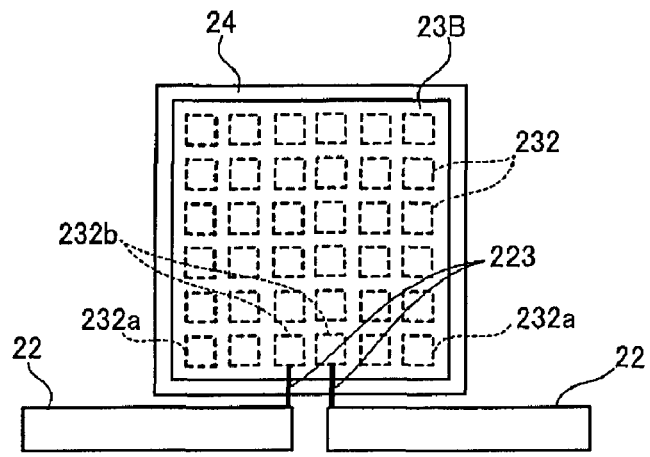
FIG. 10 is a diagram showing a surface mount package having a bottom surface on which a large number of connection terminals are arranged like the surface mount package shown in FIG. 8.

FIG. 10 is a diagram showing a surface mount package having a bottom surface on which a large number of connection terminals are arranged like the surface mount package shown in FIG. 8. The difference between the embodiment shown in FIG. 10 and the embodiment shown in FIGS. 8 and 9 will be explained. In this embodiment, connection terminals 232b close to a central portion of one side of the surface mount package 23B among the connection terminals disposed along the one side of the surface mount package 23B, except connection terminals 232a which are adjacent to corner portions, are used for connection with the antenna 22.

In this case, the influence of the thermal expansion or thermal contraction caused by temperature variation of the surface mount package 23B is also reduced as compared with a case in which a connection terminal which is adjacent to a corner portion is used for connection with the antenna.

FIG. 11 is a diagram of steps showing one example of a manufacturing method of the RFID tag as an embodiment of the present invention.

Here, a soldering paste 251 is printed on a portion of the base 21 formed with the antenna 22 to which a surface mount package is to be connected with solder (step A).

Next, the surface mount package 23 incorporating an IC chip is aligned and mounted onto the base 21 by a bonding tool 51 (step B). The soldering paste 251 is heated and solder connection is carried out by soldering reflow (step C). Next, liquid underfill 241 is injected into underneath the surface mount package 23, i.e., a gap between the base 21 and the surface mount package 23 by a dispenser 52 (step D). The injected underfill 241 is hardened by heating the same to form an underfill 24, thereby completing the inlay 20 (step E).

A lower member 311 provided with a recess 311a having a size corresponding to the base 21 is previously molded (step F), and the completed inlay 20 is set in the recess (step G).

Next, the lower member 311 with the inlay 20 set therein is set in a mold 53 having a cavity 53a corresponding to the outer shape of a sheath protecting material 31 (step H). Resin corresponding to the upper portion of the sheath protecting material 31 is injected into the cavity 53a of the mold 53, and the upper portion of the sheath protecting material 31 is molded. The upper portion and the lower member 311 are integrally formed by heat seal. Then the entire inlay 20 is enclosed in the sheath protecting material 31, and the RFID tag 30 is completed.

An RFID tag of the present invention is manufactured through the above steps, for example.

What is claimed is:

1. An RFID tag comprising:
   an inlay which includes a base, an antenna formed on the base, an IC chip which is enclosed in a surface mount package and soldered to the antenna and which carries out radio communication through the antenna, and underfill which fills a gap between the base and the surface mount package; and
   a sheath protecting material enclosing the entire inlay,
   wherein where a thermal expansion coefficient of the surface mount package is defined as $\alpha 1$,
   a thermal expansion coefficient of the underfill is defined as $\alpha 2$,
   a thermal expansion coefficient of the base is defined as $\alpha 3$, and
   a thermal expansion coefficient of the sheath protecting material is defined as $\alpha 4$, relations $\alpha 1 < \alpha 2$ and $\alpha 4 < \alpha 3$ are satisfied.

2. The RFID tag according to claim 1, wherein the surface mount package is rectangular in shape as viewed from above, the surface mount package is provided with a plurality of leads projecting from sides of the rectangular shape, the antenna and the IC chip enclosed in the surface mount package are connected with each other through any of the leads except those which are adjacent to corners at which two sides of the rectangular shape are in contact.

3. The RFID tag according to claim 1, wherein the surface mount package is rectangular in shape as viewed from above, connection terminals are arranged on a bottom surface of the surface mount package, the antenna and the IC chip enclosed in the surface mount package are connected with each other through any of the connection terminals except those which are adjacent to corners at which two sides of the rectangular shape are in contact.

4. A method of manufacturing an RFID tag comprising an inlay which includes a base, an antenna formed on the base, an IC chip which is enclosed in a surface mount package and soldered to the antenna and which carries out radio communication through the antenna, and underfill which fills a gap between the base and the surface mount package, and a sheath protecting material enclosing the entire inlay, the method comprising the steps of:

printing a soldering paste on a portion of the base on which the antenna is formed, the portion being where the surface mount package is to be soldered;

aligning and mounting the surface mount package on the base;

connecting the surface mount package to the antenna on the base by soldering reflow;

injecting underfill into a gap between the base and the surface mount package;

hardening the underfill, thereby completing the inlay;

disposing a resin lower member which has a recess into which the inlay is fitted and which corresponds to a lower portion of the sheath protecting material, together with the inlay fitted into the recess of the lower member, into a mold having a gap corresponding to an outer shape of the sheath protecting material; and molding the sheath protecting material by flowing resin corresponding to an upper portion of the sheath protecting material into the gap in the mold, thereby molding the upper portion and fusing the upper portion and the lower member together, wherein where a thermal expansion coefficient of the surface mount package is defined as $\alpha 1$, a thermal expansion coefficient of the underfill is defined as $\alpha 2$, a thermal expansion coefficient of the base is defined as $\alpha 3$, and a thermal expansion coefficient of the sheath protecting material is defined as $\alpha 4$, relations $\alpha 1 < \alpha 2$ and $\alpha 4 < \alpha 3$ are satisfied.

* * * * *